(12) United States Patent
Previtali (10) Patent No.: US 9,461,142 B2
(45) Date of Patent: Oct. 4, 2016

(54) FABRICATION METHOD OF AN IMPROVED FIELD EFFECT DEVICE

(71) Applicant: COMMISSARIAT Á L'ENERGIE ATOMIQUE ET AUX ENERGIES ALTERNATIVES, Paris (FR)

(72) Inventor: Bernard Previtali, Grenoble (FR)

(73) Assignee: COMMISSARIAT Á L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/973,027

(22) Filed: Dec. 17, 2015

(65) Prior Publication Data

US 2016/0190279 A1 Jun. 30, 2016

(30) Foreign Application Priority Data

Dec. 17, 2014 (FR) .................................... 14 62602

(51) Int. Cl.
*H01L 21/84* (2006.01)
*H01L 29/66* (2006.01)
*H01L 21/308* (2006.01)

(52) U.S. Cl.
CPC ....... *H01L 29/66477* (2013.01); *H01L 21/308* (2013.01)

(58) Field of Classification Search
CPC ... H01L 21/84; H01L 21/308; H01L 21/743; H01L 29/66477; H01L 29/66636
USPC ......................................................... 438/151
See application file for complete search history.

(56) References Cited

U.S. PATENT DOCUMENTS

| 7,915,110 B2 | 3/2011 | Coronel et al. | |
| 2005/0062080 A1* | 3/2005 | Nakamura | H01L 29/66772 257/288 |
| 2006/0027881 A1 | 2/2006 | Ilicali et al. | |
| 2009/0011562 A1* | 1/2009 | Licitra | H01L 29/458 438/283 |
| 2011/0115022 A1 | 5/2011 | Cheng et al. | |
| 2011/0241073 A1 | 10/2011 | Cohen et al. | |
| 2012/0156847 A1* | 6/2012 | Loubet | H01L 29/78 438/287 |
| 2012/0190214 A1* | 7/2012 | Vinet | H01L 29/66772 438/783 |
| 2013/0052805 A1 | 2/2013 | Previtali | |
| 2013/0299897 A1 | 11/2013 | Doris et al. | |

(Continued)

FOREIGN PATENT DOCUMENTS

EP   2562802   2/2013

OTHER PUBLICATIONS

La Tulipe, D. C. et al. "Upside-Down FETs," IEE International SOI Conference Proceedings, pp. 23-24, 2008.

(Continued)

*Primary Examiner* — Trung Q Dang
(74) *Attorney, Agent, or Firm* — Oliff PLC (57) ABSTRACT

A SOI substrate is covered by a semiconductor material pattern which comprises a dividing pattern made from electrically insulating material. The dividing pattern is coated by one or more semiconductor materials. The semiconductor material pattern is covered by a gate electrode which faces the dividing pattern. The semiconductor material pattern and the gate pattern are covered by a covering layer. The substrate is eliminated to access the source/drain regions. A second covering layer is deposited and access vias are formed to access the source/drain regions and gate electrode.

10 Claims, 9 Drawing Sheets

(56) References Cited

U.S. PATENT DOCUMENTS

2014/0175379 A1* 6/2014 Chu-Kung ............ H01L 29/267
257/20
2014/0377917 A1* 12/2014 He ...................... H01L 27/0886
438/157

OTHER PUBLICATIONS

Skotnicki, Thomas. "Silicon on Nothing (SON)—Fabrication, Material and Devices," Electrochemical Society, vol. 2001, No. 3, pp. 391-402, 2001.

* cited by examiner

FABRICATION METHOD OF AN IMPROVED FIELD EFFECT DEVICE

FIELD OF THE INVENTION

The invention relates to a fabrication method of a field effect device.

STATE OF THE ART

The continuous increase of the performances of integrated circuits, for example in terms of consumption and/or of operating frequency, is ineluctably resulting in a constant reduction of the size of its components. In order to achieve devices with constantly improved performances, new architectures and/or new materials have been integrated in the transistors.

However, it is apparent that for a large number of architectures, parasitic capacitances are occupying an increasingly important place which reduces the gains procured by the other improvements. One way of reducing these parasitic capacitances is to place the source and drain contacts on one side of the semiconductor material film forming the conduction channel and the source/drain regions. The gate electrode is located on the other side of the semiconductor film which greatly reduces the facing surface between the gate electrode and the contacts. An exemplary embodiment is described in U.S. Pat. No. 7,915,110. This fabrication does however prove complicated to achieve as it requires amorphization of the future source and drain regions and use of the difference of optic property between the amorphous regions and the crystalline regions to locate protection masks correctly.

The document US 2013/0299897 describes fabrication of an inverted transistor with source and drain contact connections on the opposite surface to the gate electrode. A gate electrode is made on a substrate of semiconductor-on-insulator type.

The gate electrode acts as etching mask to etch the semiconductor-on-insulator layer, the buried insulator layer and then a part of the semiconductor support substrate.

Epitaxy is performed from the substrate to connect the support substrate with the semiconductor-on-insulator layer. The epitaxied regions form source and drain regions. An encapsulator is deposited and is bonded to a second support substrate.

The first support substrate is eliminated to access the buried insulator layer and the source and drain regions made by epitaxy. A new encapsulator is deposited and then etched to form source and drain contacts.

This document also teaches to fabricate a second gate electrode using the buried insulator as gate dielectric.

On reading of this document, it can easily be perceived that fabrication of such a device is very difficult and that the final device will not present as good performances as expected.

OBJECT OF THE INVENTION

The object of the invention is to provide a field effect device which presents improved electric performances and which is easy to implement.

The method according to the invention is remarkable in that it successively comprises:

providing a substrate covered by
a pattern made from semiconductor material comprising a first layer made from a first semiconductor material covering a second layer made from a second semiconductor material,
a gate pattern covering the semiconductor material pattern so as to define a source region, a drain region and a conduction channel in the semiconductor material pattern,
etching the first layer of first semiconductor material using the gate pattern as etching mask,
etching the second layer of second semiconductor material so as to form a cavity and to suspend the first layer of first semiconductor material,
depositing a filling material so as to fill the cavity,
etching the filling material using the gate pattern as etching mask to form a dividing pattern in the cavity, the semiconductor material pattern covering the dividing pattern, the dividing pattern comprising at least three consecutive surfaces covered by the semiconductor material pattern,
forming the source and drain regions by selective epitaxy,
depositing a covering layer so as to cover the substrate, the semiconductor material pattern and the gate pattern,
eliminating the substrate so as to release a part of the source region, of the drain region and of the gate pattern,
depositing a second covering layer, the first and second covering layers being separated by the semiconductor material pattern over at least a part thereof,
forming access holes to the source region, the drain region and the gate pattern in the second covering layer.

In a particular embodiment, the substrate comprises a third layer of semiconductor material different from the second semiconductor material, the third layer being arranged underneath the second layer to facilitate formation of the source and drain regions.

In even more advantageous manner, to facilitate etching of the second layer, it is advantageous to provide for the first semiconductor material to be identical to the third semiconductor material.

To facilitate formation of the source and drain regions, etching the second layer and of the filling material are configured to preserve at least a part of the third layer so as to enable formation of the source and drain regions from the third layer when the selective epitaxy step is performed.

It is also advantageous to provide for the gate pattern to be used as etching mask to etch the first layer and the second layer so that the third layer comprises a region partially uncovered by the second layer and that the source and drain regions are formed by epitaxy from the partially uncovered region.

In a particular case, etching of the filling material is performed using the gate pattern as etching mask so that the third layer is partially covered by the filling material forming the dividing pattern.

In one embodiment, the substrate is a silicon-on-insulator substrate and the method comprises a condensation step of the germanium to form the second layer or a third layer made from silicon-germanium alloy.

It is advantageous to use a fourth layer made from a fourth semiconductor material different from the third semiconductor material, the fourth layer being arranged underneath the third layer.

It can be envisaged to provide for the substrate to be of silicon-on-insulator type and for the first layer to be made from silicon-germanium alloy.

The dividing pattern can be made from an electrically insulating material in a method which, after elimination of the substrate, comprises deposition of a metallic material and annealing of the latter to form an alloy between the metallic material and a semiconductor material.

BRIEF DESCRIPTION OF THE DRAWINGS

Other advantages and features will become more clearly apparent from the following description of particular embodiments of the invention given for non-restrictive example purposes only and represented in the appended drawings, in which.

Figures A represent a cross-section along a longitudinal axis of the gate electrode. Figures B represent a cross-section along a transverse axis of the gate electrode.

DESCRIPTION OF PREFERRED EMBODIMENTS OF THE INVENTION

Figure 1A:
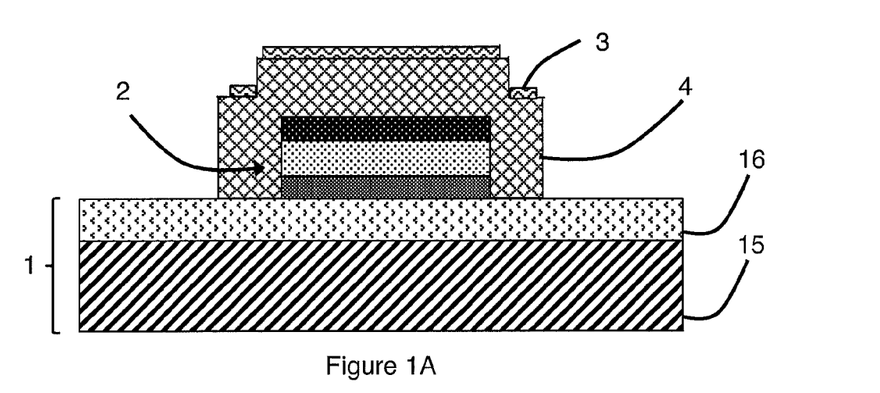
FIGS. 1 to 10 represent successive steps of a fabrication method of a field effect transistor, in schematic manner, in cross-sectional view.
Figure 1B:
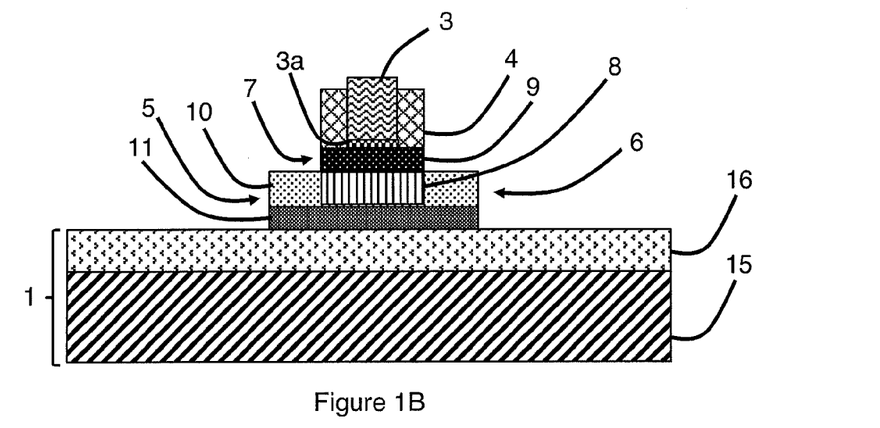

As illustrated in FIG. 1, the fabrication method of the field effect device in a first stage comprises provision of a substrate 1 one surface of which is covered by a pattern made from semiconductor material 2. The semiconductor material pattern 2 is partially covered by a gate pattern 3. The semiconductor material pattern 2 can also be covered by a lateral spacer 4. In the illustrated embodiment, the semiconductor material pattern 2 is salient from the substrate 1. FIG. 1A represents a cross-section along a longitudinal axis of the gate pattern. FIG. 1B represents a cross-section along a transverse axis of the gate pattern.

Inside the semiconductor material pattern 2, the gate pattern 3 defines a source region 5, a drain region 6 and a conduction channel which connects the source region 5 and drain region 6. The conduction channel is arranged underneath the gate pattern 3.

The semiconductor material pattern 2 can comprise a salient region also called conduction region 7 which is located underneath the gate pattern 3 and between the future source region 5 and drain region 6. The conduction region 7 is made from semiconductor material. It can also be envisaged to have a continuous film which forms the conduction channel and the source and drain regions 5 and 6. In this configuration, the conduction region 7 is not necessarily salient with respect to the source and drain regions. The conduction region corresponds substantially or exactly to the future conduction channel.

The semiconductor film of FIG. 1B can overlap on each side so as to extend beyond the gate pattern 3.

The semiconductor material pattern 2 covers or coats a dividing pattern 8 which is arranged underneath the gate electrode 3 and more precisely underneath the conduction region 7 so that the source region 5 and drain region 6 are separated by the dividing pattern 8 over at least a part of the thickness thereof. The dividing pattern 8 comprises at least three consecutive surfaces covered by the semiconductor material pattern 2.

In a particular embodiment, the semiconductor material pattern 2 is formed by a stack of at least a first layer 9 made from first semiconductor material covering a second layer 10 made from second semiconductor material. The two semiconductor materials 9 and 10 are different. In advantageous manner, the first and second layers are monocrystalline and preferentially present a lattice match. The first layer 9 is for example made from silicon and the second layer 10 is made from silicon-germanium alloy, preferably an alloy containing 30% of germanium, preferably 30% atomic. In an alternative embodiment, the first layer 9 is a silicon-germanium alloy, for example an alloy containing 30% of germanium, preferably 30% atomic, and the second layer 10 is made from silicon.

Figure 2:
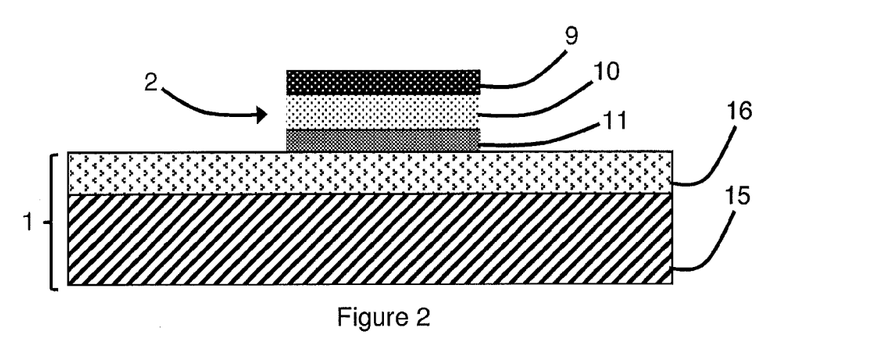

In an even more advantageous embodiment illustrated in FIGS. 1A, 1B and 2, the second layer 10 made from second semiconductor material covers a third layer 11 made from third semiconductor material. The second semiconductor material is different from the third semiconductor material. The first semiconductor material can be identical to the third semiconductor material. Advantageously, the three layers 9, 10 and 11 are monocrystalline and preferentially present a lattice match.

The first and third layers 9 and 11 are for example made from silicon and the second layer 10 is made from silicon-germanium alloy, preferentially an alloy containing 30% of germanium, preferably 30% atomic.

As a variant, the first and third layers 9 and 11 are for example made from silicon-germanium alloy, preferentially an alloy containing 30% of germanium, preferably 30% atomic, and the second layer 10 is made from silicon.

It is advantageous to use a substrate of semiconductor-on-insulator type where the semiconductor material layer is layer 10 or layer 11 according to the number of layers used in the stack. The substrate can therefore be of silicon-on-insulator type or of silicon/germanium-on-insulator type.

It is also possible to form the bottom layer of the stack, i.e. layer 10 or layer 11, from a germanium condensation step. For example, the initial substrate is of silicon-on-insulator type and a silicon-germanium layer is deposited. By means of the germanium condensation step, the silicon layer is transformed into a silicon-germanium layer or even a pure germanium layer. It is then possible to deposit a silicon layer by epitaxy.

In an alternative embodiment, the substrate is of silicon-on-insulator type and a stack of four layers is formed so as to define future channels made from silicon-germanium alloy. The fourth layer 11' made from fourth semiconductor material is covered by the third layer 11. The materials of the third and fourth layers are different.

The fourth layer 11' enables a substrate of silicon-on-insulator type to be used while at the same time forming a future silicon-germanium alloy channel. The silicon layer 11' is then covered by a silicon-germanium alloy layer 11 and then by a silicon layer 10 and finally by a silicon-germanium alloy layer 9. The use of a stack with four layers facilitates the future epitaxy step to form the source and drain regions from the layer 11 which in this case is made from silicon-germanium alloy.

This advantageous structure can be produced simply by means of the method which follows.

Figure 3A:
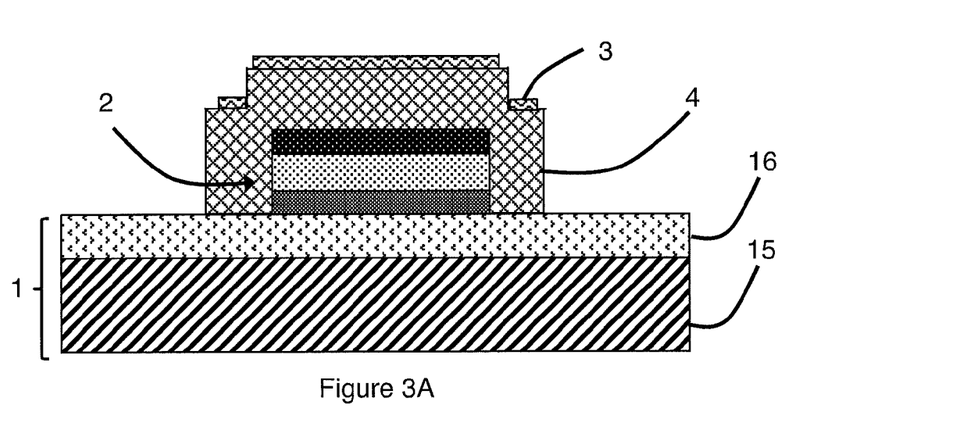
Figure 3B:
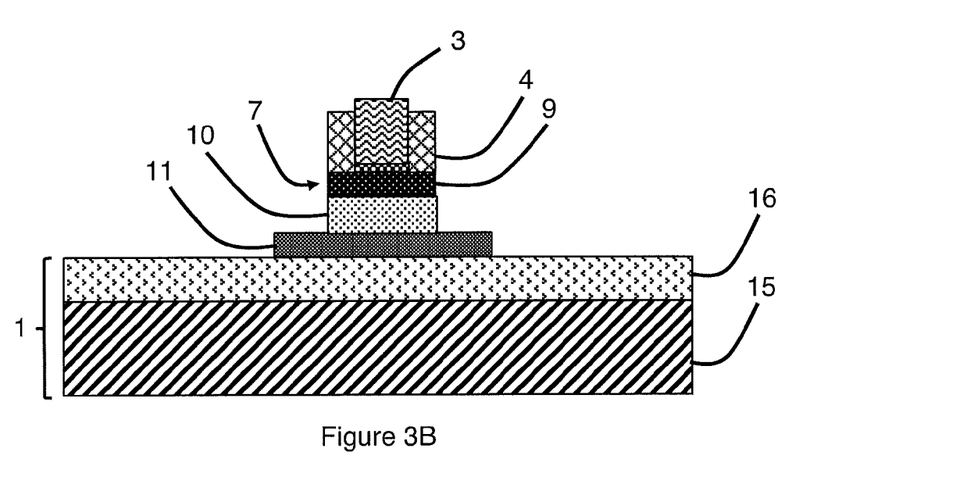

In advantageous manner illustrated in FIGS. 3A and 3B, the gate pattern 3 and lateral spacer 4 are formed on the pattern 2 and are used to act as etching mask for the first layer 9 and second layer 10. The etched region in the first layer 9 forms the conduction region 7 which is representative of the conduction channel. Etching is advantageously anisotropic etching in order to define a conduction region 7 which presents the same lateral dimensions or substantially the same lateral dimensions as the gate electrode 3 and lateral spacer 4. The lateral spacer 4 can be formed by one or more layers. It is particularly advantageous to have a gate pattern 3 which overlaps on the two opposite edges of the pattern 2.

In a stack with three or four layers, it is advantageous not to pattern the third layer or the fourth layer 11' so that it overlaps beyond the pattern formed by layer 10.

Figure 4A:
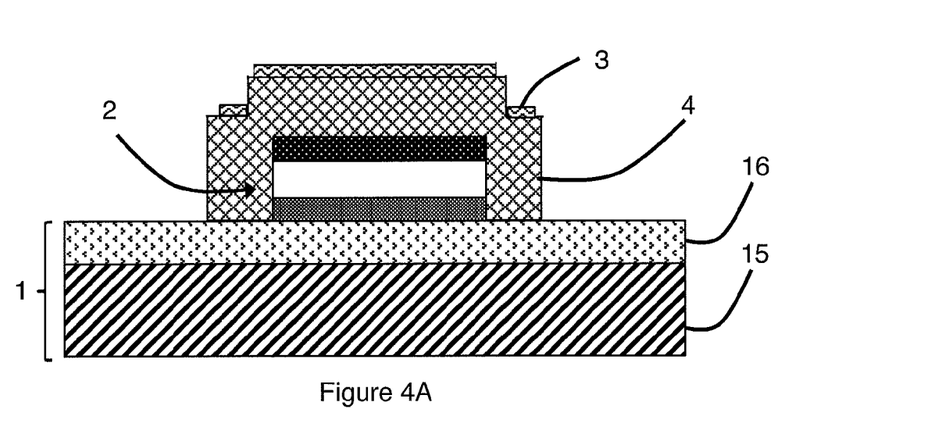
Figure 4B:
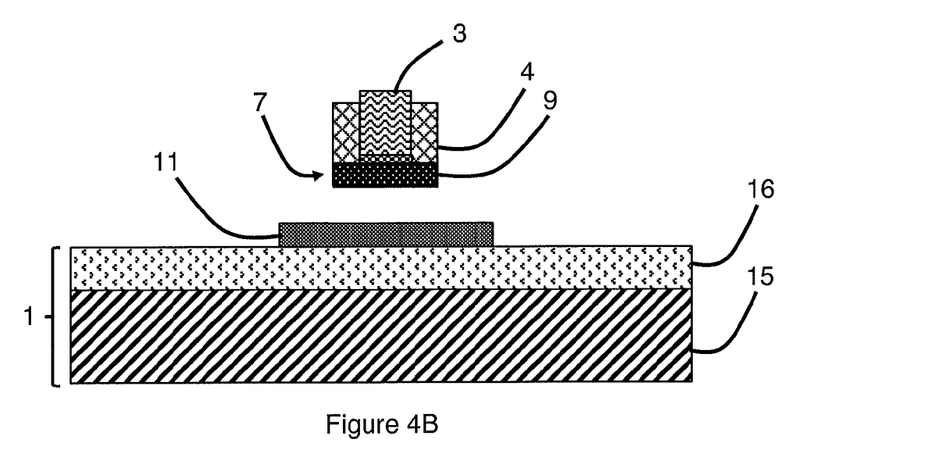

As illustrated in FIGS. 4A and 4B, the second layer 10 is then eliminated by any suitable technique. Etching can be performed by a wet etch method or a dry etch method. The first layer 9 is then suspended above substrate 1. The first layer 9 is secured by means of gate pattern 3 and/or lateral spacer 4. Etching of the second layer 10 is advantageously isotropic etching. Etching of the second layer 10 forms a cavity underneath layer 9.

Figure 5A:
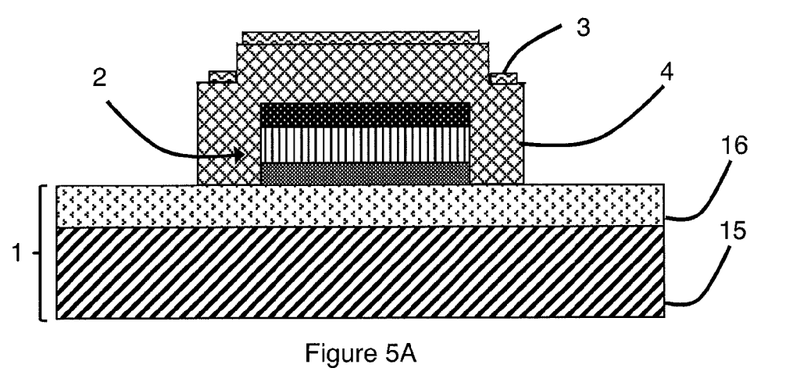
Figure 5B:
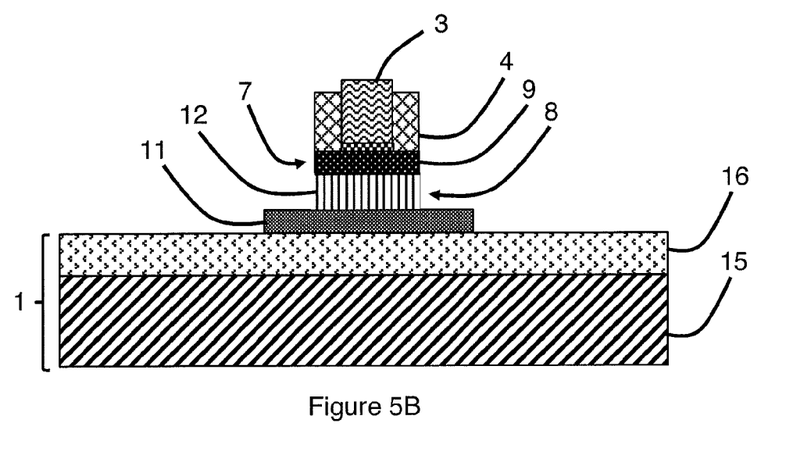

As illustrated in FIGS. 5A and 5B, a filling material 12 is deposited and etched so as to fill the cavity located underneath the first layer 9 in the extension of the gate pattern 3 and possibly of the lateral spacer 4. In this way, the conduction pattern 7 and filling material 12 forming the dividing pattern 8 present aligned side walls which form the walls of the pattern 2.

In advantageous manner, the filling material 12 is deposited in conformal manner so as to completely fill the cavity. The gate pattern 3 and lateral spacer 4 are again used to make an etching mask which localises the filling material 12 only underneath the first layer 9. The pattern made of filling material 12 forms the dividing pattern 8. The filling material 12 is for example a silicon oxide and more particularly an oxide deposited at high temperature. The thickness of filling material 12 is advantageously more than half of the thickness of second layer 10 or of the height of the cavity which exists underneath the first layer 9.

As a variant, another filling material can be deposited such as a silicon nitride or a stack of several layers. It can also be envisaged to provide for oxidation of the first layer 9 to fill the cavity. If the latter is the case, the thickness and width of the first layer 9 are chosen accordingly and deoxidation of the flanks of the first layer 9 is performed to enable a subsequent epitaxy step. If a layer 11 is used, the latter can be oxidized.

It is also possible to provide for filling of the cavity by several layers at least one of which is subjected to a tensile or compressive stress so as to apply stresses on the conduction channel. In advantageous manner, for an Nmos transistor, the stack of layers comprises at least one tensile-stressed silicon nitride layer. For a Pmos transistor, the stack of layers comprises at least one compressive-stressed silicon nitride layer.

This architecture is particularly advantageous as it enables the conduction channel to be located underneath the gate pattern 3 and in the same way enables the dividing pattern 8 to be located underneath the gate pattern. The spacers 4 can be used to define the length of the conduction channel and the size of the dividing pattern. In this case, the channel and dividing pattern 8 are self-aligned with the gate pattern 3. Formation of the source and drain regions subsequently enables a dividing pattern encapsulated by semiconductor materials to be easily formed.

Figure 6A:
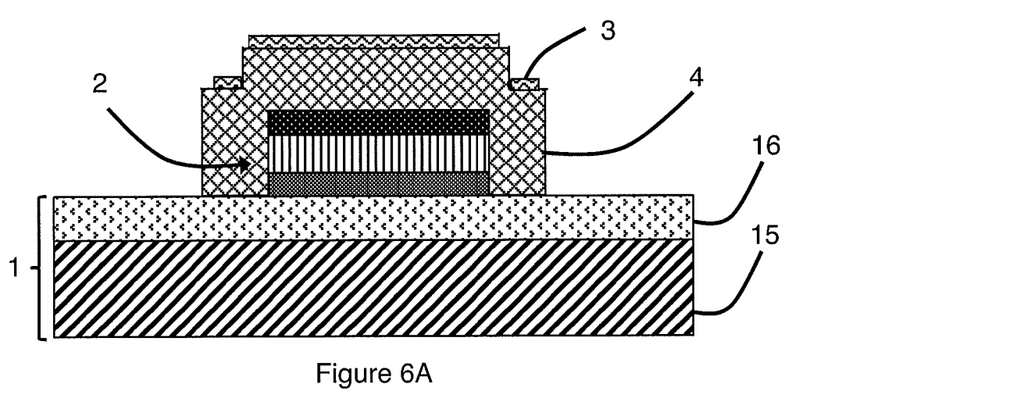
Figure 6B:
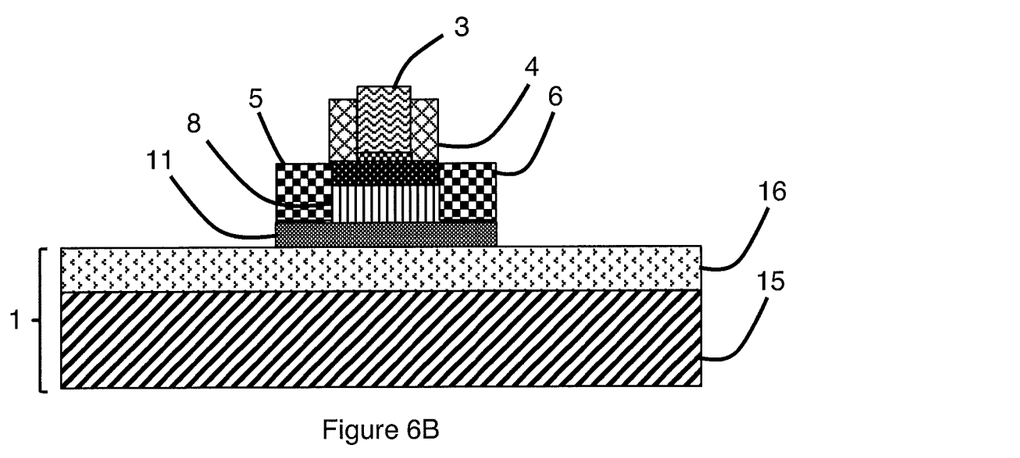

As illustrated in FIGS. 6A and 6B, selective epitaxy is then performed to make a semiconductor material grow from the first layer 9 and to form the source and drain regions. In this case, it is particularly advantageous to use the third layer 11 which enables the available surface for initiating the epitaxy to be increased. The deposited semiconductor material will form the source region 5 and drain region 6.

The document US2013/0299897 describes growth of a silicon or silicon-germanium layer from the support substrate and the semiconductor-on-insulator layer. The support substrate and the semiconductor-on-insulator layer are however not aligned when formation of the semiconductor-on-insulator substrate takes place. This slight misalignment prevents very good-quality epitaxy resumption and crystalline defects may form in the source and drain regions. In the method presented in the foregoing on the other hand, epitaxy is performed from layer 9 or from layers 9 and 11 which were initially lattice-matched. This precaution enables a better quality epitaxy resumption to be had.

To form different transistors, it is also possible to provide different stacks on the substrate, for example with different thicknesses of layer 10, which is not possible with a semiconductor-on-insulator substrate.

The semiconductor material pattern 2 can be doped by implantation of electric dopants in the source region 5 and drain region 6. If epitaxy is performed, it can also be envisaged to perform in-situ doping when deposition of the semiconductor material by epitaxy is performed.

When the selective epitaxy step is performed, it is possible to differentiate between Nmos transistors and Pmos transistors by performing two different steps which are designed to deposit two different materials. For Pmos transistors, it is advantageous to deposit a silicon-germanium alloy. For Nmos transistors, it is advantageous to deposit silicon.

The use of a semiconductor-on-insulator substrate as described in the document US 2013/0299897 does not either enable tensile-stressed regions and compressive-stressed regions to be formed by means of the buried insulator layer.

In an advantageous embodiment that is not represented, a second lateral spacer is formed in addition to lateral spacer 4. This second lateral spacer covers a part of the source and drain regions. Implantation of electric dopants is performed with a larger dose so as to form weakly resistive source/drain regions. The second lateral spacer enables the dopants to be offset with respect to the conduction channel.

Figure 7A:
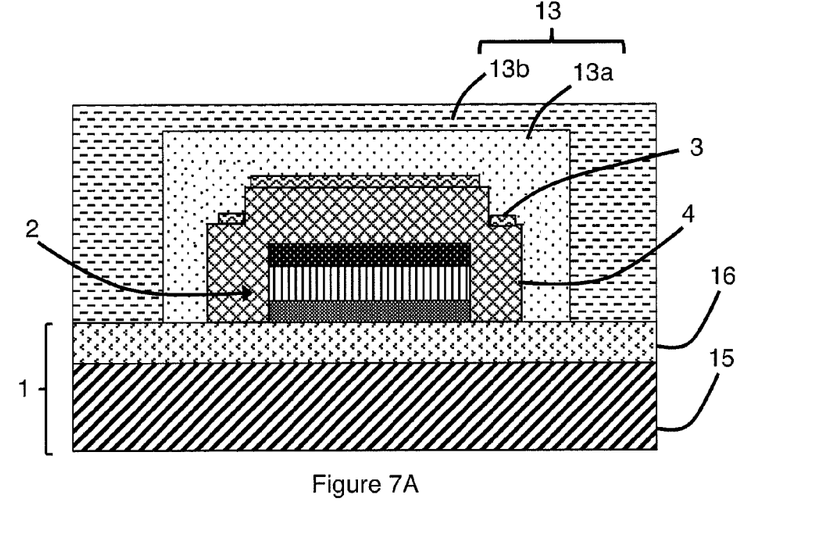
Figure 7B:
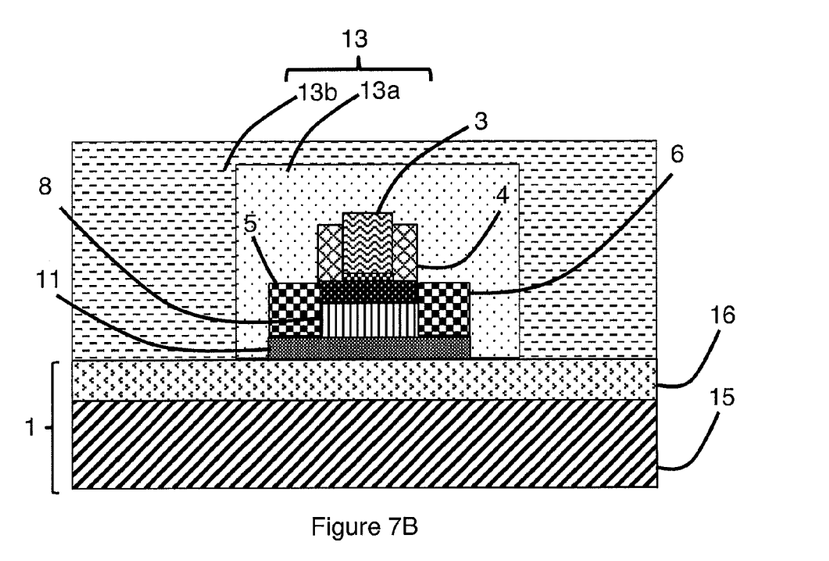

As illustrated in FIGS. 7A and 7B, the assembly is then covered by at least one electrically insulating covering layer 13. In the illustrated embodiment, the covering layer comprises a first covering sub-layer 13a which is in contact with the source/drain regions and the gate pattern 3. A second covering sub-layer 13b is deposited so as to cover the first sub-layer 13a and form a flatter external surface. In advantageous manner, a planarization step is performed to form a flat top surface. Planarization is for example achieved by a chemical mechanical polishing step. The layer 13a can be patterned before deposition of the layer 13b or be left unchanged.

Figure 8A:
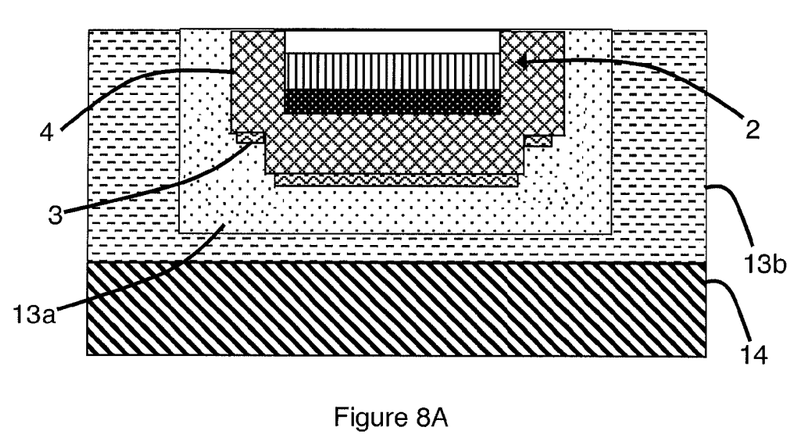
Figure 8B:
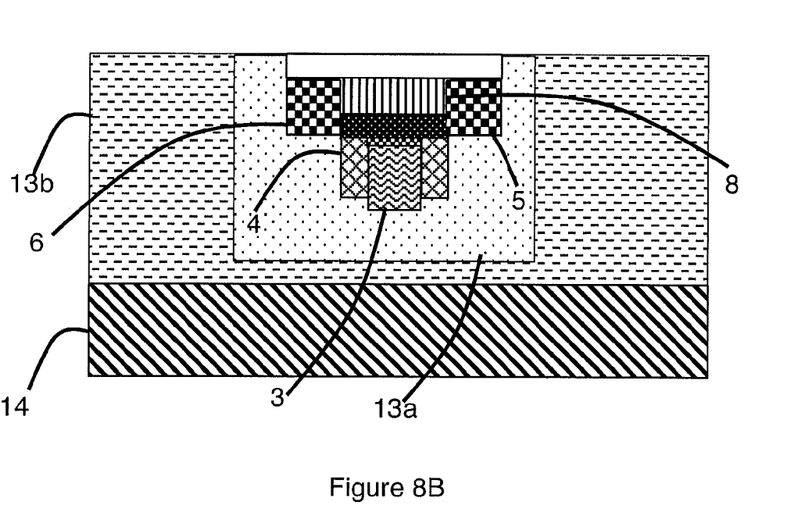

As illustrated in FIGS. 8A and 8B, the top surface of the covering layer 13 is then fixed to a second substrate 14 and the first substrate 1 is eliminated so as to access the dividing pattern 8, source region 5 and drain region 6 and gate pattern 3. In advantageous manner, the top surface of covering layer 13 is bonded to second substrate 14. The second substrate 14 is for example a bulk silicon substrate which advantageously comprises a silicon oxide layer on the surface to facilitate bonding of covering layer 13. In the embodiment illustrated in FIGS. 8A and 8B, layer 11 is totally eliminated. As a variant, it is possible to leave layer 11 on the source and drain regions but a specific etching mask has to be formed to prevent short-circuiting between the source and drain regions. The layer 11 can be electrically conducting to subsequently form the source and drain contacts. The same is the case for the fourth layer 11' when it is used.

To facilitate elimination of the first substrate 1, it is advantageous to use a semiconductor-on-insulator substrate in which the second layer 10 or third layer 11 is formed by the active layer active of substrate 1. This active layer is separated from support substrate 15 by electrically insulating layer 16. The support substrate 15 is eliminated to access electrically insulating layer 16. The electrically insulating layer 16 is then eliminated which frees access to the source/drain regions, the dividing pattern 8 and gate pattern 3. Silicon support substrate 15 can be eliminated by mechanical abrasion followed by chemical abrasion with a TMAH solution. Electrically insulating layer 16 can then be eliminated by a solution of hydrofluoric acid type. For example, a solution containing between 0.1% and 2% of hydrofluoric acid makes it possible to have a large selectivity with respect to the materials commonly used in formation of a field effect device, for example silicon nitride, and a gate dielectric of higher permittivity.

As a variant, it is also possible to provide a substrate 1 which comprises a support part 15 separated from the second or third layer by a different material 16 so as to facilitate etching of the support 15 with detection of the layer of different material 16. The layer of different material 16 is then selectively etched to free access to the required regions. The different material 16 is for example layer of silicon-germanium alloy.

Figure 9A:
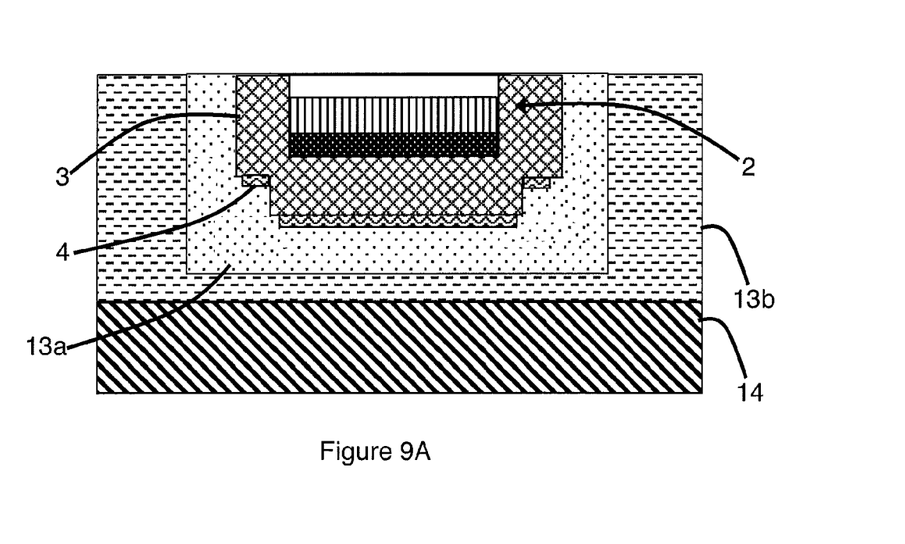
Figure 9B:
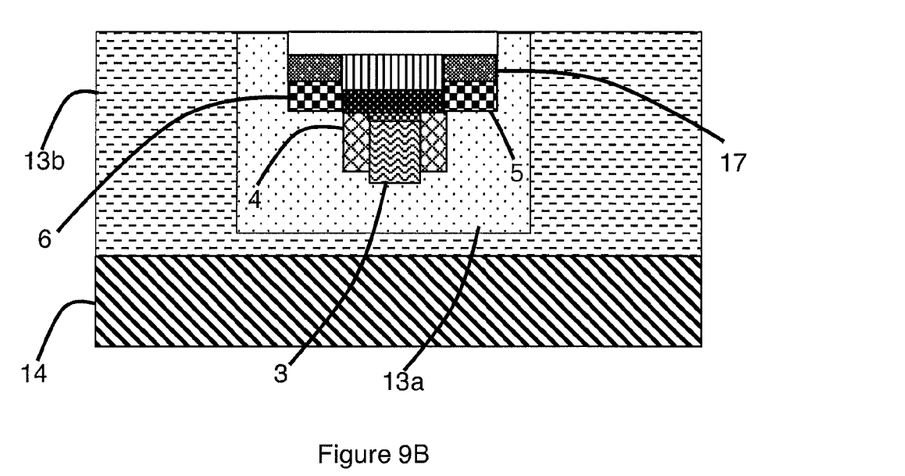

As illustrated in FIGS. 9A and 9B, once access to the source/drain regions has been created, it is advantageous to make the semiconductor material forming the source/drain regions 5 and 6 react with a metal to form an alloy 17. This alloy 17 enables the contact resistance of the source/drain regions 5 and 6 to be reduced. The alloy 17 comprises at least one semiconductor material originating from the pattern 2, for example silicon and/or germanium. The alloy 17 also comprises the deposited metal, for example titanium, cobalt or nickel. The alloy 17 can be a silicide.

It is particularly advantageous to form the alloy after the support has been changed, for example after formation of covering layer 13 or after elimination of support substrate 15. Indeed, when the layer providing the mechanical support of the future transistor is changed, an annealing step may be performed to ensure a good bonding for example between covering layer 13 and layer 16. This thermal budget linked to the bonding can partially impair the alloy which then presents less good electric performances.

For the same reasons, it is also advantageous to form the alloy of the gate pattern 3 after the bonding thermal budget or at least after deposition of the covering layer 13. Furthermore, if the alloy is formed before the chip-flip, to access the gate pattern, it may be necessary to pass through the source/drain regions. In this case, the vertical part of the contact hole can be devoid of alloy which reduces the gain on the electric performances.

If the layer 11 is used, it may be advantageous to eliminate layer 11 to access the source and drain regions and to prevent short-circuiting straight away. The layer 11 is preferably eliminated before depositing a metallic material and making it react with a semiconductor material as removal is more complicated.

If a metal is deposited to form an alloy in the source/drain regions 5 and 6, it is advantageous to provide a dividing pattern 8 made from a material which does not react with metal to avoid a short-circuit being formed between source electrode 5 and drain electrode 6. It is also advantageous to provide a dividing pattern 8 that is electrically insulating.

A pattern 8 made from silicon oxide or from silicon nitride is particularly advantageous as it avoids the presence of a short-circuit between the source region 5 and drain region 6.

As a variant, it is possible to etch the short-circuited region but this imposes an additional photolithography step.

If the dividing pattern 8 is electrically conductive, it is at least partially eliminated to prevent short-circuiting between the source region 5 and drain region 6.

The metal which did not react with the semiconductor material to form the alloy 17 is eliminated.

As a variant, once access to the source/drain regions has been created, it is also possible to perform implantation of electric dopants in the source 5 and drain 6 regions. This way of proceeding is particularly advantageous as the transistor is almost completed and the implantation energy is minimal. The dividing pattern 8 protects the conduction channel and a part of the gate electrode 3. It is possible to perform the implantation before depositing metal or another electrically conducting material.

Figure 10A:
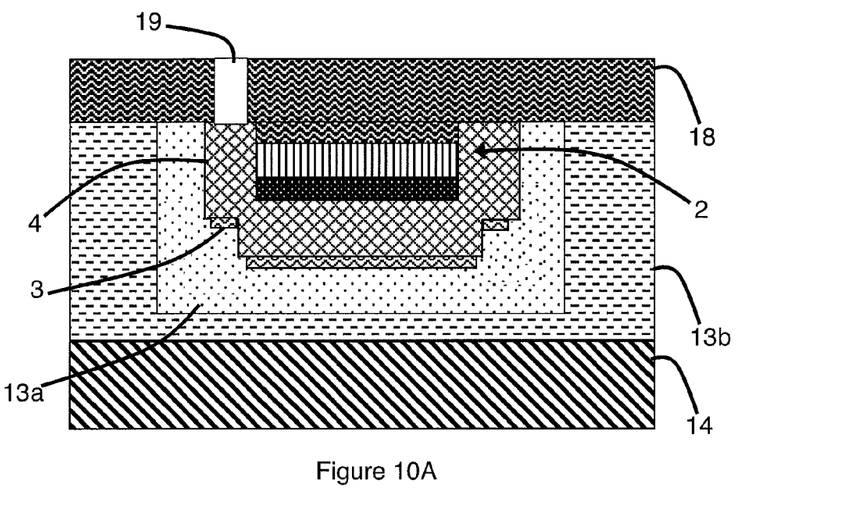
Figure 10B:
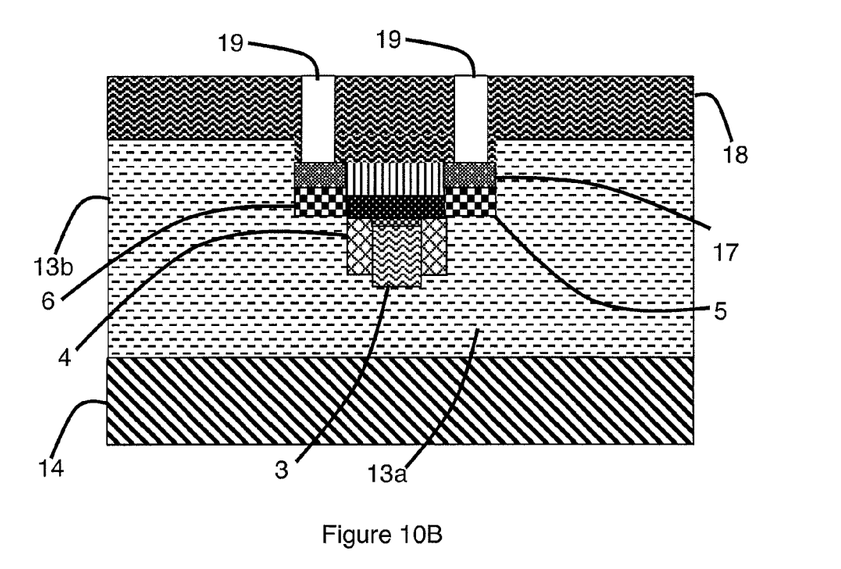

As illustrated in FIGS. 10A and 10B, the source/drain regions, gate pattern 3 and dividing pattern 8 are covered by a second electrically insulating covering layer 18 which can be identical to the first covering layer 13 or different from the latter.

Contact vias 19 are formed in the covering layer 18 to access the source region 5, drain region 6 and gate pattern 3. The contact holes are filled by an electric conductor, for example a metal to connect the field effect device.

In this configuration, the source and drain contacts do not come close to the gate electrode 3 which allows a greater flexibility in positioning of the contacts. The electric capacitances between the gate electrode 3 and the source/drain contacts are also greatly reduced. The source 5 and drain 6 contacts are located on one side of the conduction channel and the gate electrode is mainly arranged on the other side of the conduction channel.

The gate contact is advantageously offset to the end of the semiconductor material pattern 2, preferably outside the pattern 2.

In a particular embodiment that is not represented, the electrically insulating layer 16 is kept. Holes are formed to access the source region 5 and drain region 6. The same is applicable for access to the gate pattern 3. If a layer 11 is used, the holes are configured to prevent short-circuiting between the source and drain regions via layer 11.

The second covering layer 18 is deposited on the electrically insulating layer 16 and access holes are formed. A first series of holes can be formed before deposition of the second covering layer 18 and a second series of holes is formed after deposition of the covering layer 18. It is also possible to form the holes only after deposition of the second covering layer 18.

The gate pattern 3 can be used to actuate the field effect device. The gate pattern is then a gate electrode 3 which comprises an electrically conducting material which is separated from the conduction channel by an electrically insulating material also called gate dielectric 3a.

In another embodiment, the gate pattern 3 is called "false gate" and it is removed to form the new cavity. The volume of the new cavity delineated by the semiconductor material pattern 2 and layer 13 is then filled by a gate dielectric 3a and by an electrically conducting material which will form the gate conductor.

This method is particularly advantageous to form Nmos and Pmos transistors as regions with different stacks can be easily fabricated.

The invention claimed is:

1. A fabrication method of a field effect device successively comprising:
   providing a substrate covered by
      a pattern made from semiconductor material comprising a first layer made from a first semiconductor material covering a second layer made from a second semiconductor material,
      a gate pattern covering the semiconductor material pattern so as to define a source region, a drain region and a conduction channel in the semiconductor material pattern,
   etching the first layer of first semiconductor material using the gate pattern as etch mask,
   etching the second layer of second semiconductor material so as to form a cavity and to suspend the first layer of first semiconductor material,
   depositing a filling material so as to fill the cavity,
   etching the filling material using the gate pattern as etch mask to form a dividing pattern in the cavity, the semiconductor material pattern covering the dividing pattern, the dividing pattern comprising at least three consecutive surfaces covered by the semiconductor material pattern,
   forming the source and drain regions by selective epitaxy,
   depositing a covering layer so as to cover the substrate, the semiconductor material pattern and the gate pattern,
   eliminating the substrate so as to release a part of the source region, of the drain region and of the gate pattern,
   depositing a second covering layer, the first and second covering layers being separated by the semiconductor material pattern over at least a part thereof,
   forming access holes to the source region, the drain region and the gate pattern in the second covering layer.

2. The method according to claim 1, wherein the substrate comprises a third layer made from third semiconductor material different from the second semiconductor material, the third layer being arranged underneath the second layer.

3. The method according to claim 2, wherein the first semiconductor material is identical to the third semiconductor material.

4. The method according to claim 2, wherein the etches of the second layer and of the filling material are configured to preserve at least a part of the third layer so as to enable formation of the source and drain regions from the third layer when the selective epitaxy step is performed.

5. The method according to claim 2, wherein the gate pattern is used as etch mask to etch the first layer and the second layer so that the third layer comprises a region partially uncovered by the second layer and in that the source and drain regions are formed by epitaxy from the partially uncovered region.

6. The method according to claim 2, wherein etching of the filling material is performed using the gate pattern as etch mask so that the third layer is partially covered by the filling material forming the dividing pattern.

7. The method according to claim 1, wherein the substrate is a silicon-on-insulator substrate and in that it comprises a condensation step of the germanium to form the second layer or a third layer made from silicon-germanium alloy.

8. The method according to claim 1, comprising a fourth layer made from a fourth semiconductor material different from the third semiconductor material, the fourth layer being arranged underneath the third layer.

9. The method according to claim 7, wherein the substrate is of silicon-on-insulator type and in that the first layer is made from silicon-germanium alloy.

10. The method according to claim 1, wherein the dividing pattern is made from an electrically insulating material and in that, after elimination of the substrate, it comprises deposition of a metallic material and annealing of the latter to form an alloy between the metallic material and a semiconductor material.

* * * * *